United States Patent
Schneider

(10) Patent No.: US 12,079,622 B2
(45) Date of Patent: Sep. 3, 2024

(54) INTERRUPTABLE BSDIFF DELTA DECOMPRESSION

(71) Applicant: Honeywell International Inc., Charlotte, NC (US)

(72) Inventor: Maximilian Waldo Schneider, Mainz (DE)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 151 days.

(21) Appl. No.: 17/647,091

(22) Filed: Jan. 5, 2022

(65) Prior Publication Data

US 2023/0214210 A1    Jul. 6, 2023

(51) Int. Cl.
G06F 8/656 (2018.01)
G06F 8/65 (2018.01)
H03M 7/30 (2006.01)

(52) U.S. Cl.
CPC .............. *G06F 8/656* (2018.02); *G06F 8/65* (2013.01); *H03M 7/6005* (2013.01)

(58) Field of Classification Search
None
See application file for complete search history.

(56) References Cited

U.S. PATENT DOCUMENTS

| | | | |
|---|---|---|---|
| 5,359,676 A | 10/1994 | Fan | |
| 5,835,740 A | 11/1998 | Wise | |
| 6,081,752 A | 6/2000 | Benson, IV et al. | |
| 6,636,958 B2 | 10/2003 | Abboud et al. | |
| 7,111,142 B2 | 9/2006 | Spencer | |
| 7,549,042 B2 | 6/2009 | Glaum et al. | |
| 7,657,533 B2 | 2/2010 | Gold | |
| 7,734,932 B2 | 6/2010 | Buer | |
| 7,747,980 B2 | 6/2010 | Illowsky | |
| 7,805,719 B2 | 9/2010 | O'Neil | |

(Continued)

FOREIGN PATENT DOCUMENTS

| EP | 2017726 A2 | 1/2009 |
|---|---|---|
| EP | 2711858 A1 | 3/2014 |

(Continued)

OTHER PUBLICATIONS

Stolikj, M., Cuijpers, P. J. L., & Lukkien, J. J. (2012). Efficient reprogramming of sensor networks using incremental updates and data compression. (Computer science reports; vol. 1210). Eindhoven: Technische Universiteit Eindhoven (14 pages total).

(Continued)

*Primary Examiner* — Jason D Mitchell
(74) *Attorney, Agent, or Firm* — John Maldjian, Esq.; Stevens & Lee PC

(57) ABSTRACT

A method includes inputting at least one compressed image in a computing system. The method also includes an inplace patching process. Another image is decompressed over the compressed image by a processor. Local variables are stored periodically, receiving restored power after an interruption to the inplace patching, wherein an execution of the inplace patching is resumed at a later time interval by the processor by restoring the local variables. The method also includes completing the inplace patching process of decompressing the image over the inputted compressed image after restoring the local variables.

18 Claims, 4 Drawing Sheets

(56) References Cited

U.S. PATENT DOCUMENTS

| | | | |
|---|---|---|---|
| 7,886,093 | B1 | 2/2011 | Chen |
| 8,055,096 | B2 | 11/2011 | Dahms et al. |
| 8,135,958 | B2 | 5/2012 | Greco et al. |
| 8,201,054 | B2 | 6/2012 | Slyz et al. |
| 8,341,604 | B2 | 12/2012 | Codrescu |
| 8,522,233 | B2 | 8/2013 | Nakamura et al. |
| 8,943,492 | B2 | 1/2015 | Scian et al. |
| 9,720,616 | B2 | 8/2017 | Yu |
| 10,055,353 | B2 | 8/2018 | Nachimuthu et al. |
| 10,972,741 | B2 | 4/2021 | Simpson |
| 10,983,704 | B1 | 4/2021 | Van Gaasbeck |
| 2003/0022665 | A1 | 1/2003 | Rajaram |
| 2005/0114852 | A1 | 5/2005 | Chen et al. |
| 2009/0070374 | A1* | 3/2009 | Eker .............. G06F 8/658 |
| 2009/0274294 | A1 | 11/2009 | Itani |
| 2010/0325523 | A1 | 12/2010 | Slyz et al. |
| 2012/0102477 | A1 | 4/2012 | Kim |
| 2012/0150877 | A1 | 6/2012 | Ramamurthy |
| 2012/0198154 | A1 | 8/2012 | Keith, Jr. |
| 2012/0227036 | A1 | 9/2012 | Crk |
| 2013/0024545 | A1 | 1/2013 | Sheppard |
| 2016/0378511 | A1 | 12/2016 | Jung |
| 2017/0048303 | A1 | 2/2017 | Szilagyi |
| 2017/0090903 | A1 | 3/2017 | Bainville |
| 2017/0118675 | A1 | 4/2017 | Boch |
| 2017/0212750 | A1 | 7/2017 | Stutzenberger |
| 2017/0337204 | A1 | 11/2017 | Szilagyi |
| 2018/0060235 | A1 | 3/2018 | Yap et al. |
| 2018/0095668 | A1 | 4/2018 | Malyugin et al. |
| 2018/0173723 | A1 | 6/2018 | Pfeifle et al. |
| 2019/0146775 | A1 | 5/2019 | Wang |
| 2019/0265965 | A1 | 8/2019 | Acharya et al. |
| 2019/0324646 | A1 | 10/2019 | Homma |
| 2020/0118516 | A1 | 4/2020 | Kim |
| 2020/0241988 | A1 | 7/2020 | Toya |
| 2020/0310782 | A1 | 10/2020 | Ujiie et al. |
| 2021/0373881 | A1 | 12/2021 | Schneider |
| 2023/0168928 | A1* | 6/2023 | Schneider .......... H03M 7/3086 712/220 |
| 2023/0169020 | A1 | 6/2023 | Schneider |
| 2023/0205514 | A1* | 6/2023 | Schneider .......... G06F 8/658 717/169 |

FOREIGN PATENT DOCUMENTS

| | | | | |
|---|---|---|---|---|
| EP | 3680773 | A1 * | 7/2020 | ............ G06F 8/64 |
| JP | 2003-216465 | A | 7/2003 | |
| KR | 10-1003888 | B1 | 12/2010 | |
| KR | 10-1541112 | B1 | 1/2015 | |
| WO | 2010017326 | A1 | 2/2010 | |
| WO | 2018091085 | A1 | 5/2018 | |
| WO | 2019042546 | A1 | 3/2019 | |
| WO | 2019077607 | A1 | 4/2019 | |
| WO | 2020088913 | A1 | 5/2020 | |

OTHER PUBLICATIONS

European Search Report mailed May 15, 2023 issued in connection with corresponding EP Application No. 22211904.2 (12 pages total).

European Search Report mailed Apr. 5, 2023 issued in connection with corresponding EP Application No. 22210343.4 (11 pages total).

European Search Report mailed May 23, 2023 issued in connection with corresponding EP Application No. 22210345.9 (8 pages total).

Moran, Brendan et al. "A Firmware Update Architecture for Internet of Things." Retrieved from: https://tools.ietf.org/id/draft-ietf-suit-architecture-08.html, Retrieved on Jun. 17, 2021 (18 pages total).

Usama M, Zakaria N (2017) Chaos-Based Simultaneous Compression and Encryption for Hadoop. PLoS One 12(1): e0168207. https://doi.org/10.1371/journal.pone.0168207 (18 pages total).

T. Subhamastan Rao et al., / (IJCSIT) International Journal of Computer Science and Information Technologies, vol. 2(5), 2011, 2369-2374 (6 pages total).

Pillai, Vysakh P., "Secure firmware upgrade for embedded systems" (2017) Retrieved from: https://embeddedinn.xyz/articles/tutorial/Secure-Firmware-upgrade-for-embedded systems/, Retrieved on: Jul. 7, 2021 (7 pages total).

Reddy, Rakesh, "Upgrading Embedded Design Firmware via USB", Published in Embedded.com (http://www.embedded.com) Jun. 2008 (5 pages total).

McDonagh, Colin, "Efficient Wireless Incremental Updates to Resource-Constrained Devices", Dissertation submitted to the University of Dublin, Trinity College, May 2018 (66 pages total).

European Search Report mailed Jun. 1, 2023, issued in connection with corresponding EP Application No. 22214493.3 (8 pages total).

GZIP(1): General Commands Manual, 1993, Jean-loup Gailly (7 pages total).

History of Lossless Data Compression Algorithms, Jan. 2019 (19 pages total).

Kumar Amit Mehta, "Fail-proof Over the Air Firmware Upgrade for Embedded Systems", 2016, Tallinn University of Technology, 2019, (80 pages).

Krishnan et al., "Secure Intermittent Computing Protocol: Protecting State Across Power Loss", IEEE Xplore, 2019, (6 pages).

Canadian Office Action mailed May 3, 2024; issued in connection with corresponding Canadian Patent Application No. 3,183,509 (5 pages total).

Canadian Office Action mailed May 2, 2024; issued in connection with corresponding Canadian Patent Application No. 3,183,469 (6 pages total).

Canadian Office Action mailed May 15, 2024 issued in connection with corresponding Canadian patent application No. 3,184,605 (4 pages total).

* cited by examiner

100

High level example system diagram

200

1. Internal or External memory space. RAM/Flash/EEprom/Etc

Compressed file is loaded into the memory space
2. 

Patch application begins. Output is produced as input is consumed
The process state is tracked by the X, Y variables.
3. 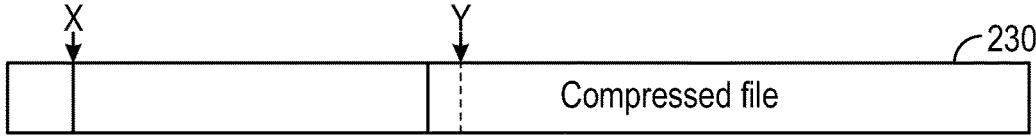

The process is performed in chunks.
X and Y are updated AFTER a chunk is complete
4. 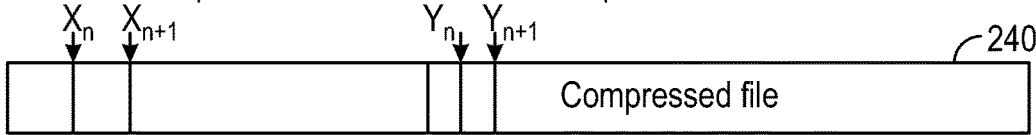

The Compressed file is overwritten as the output file is produced.
5. 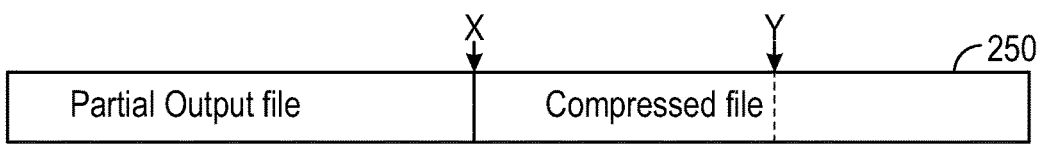

If interrupted the internal state is saved i.e. X and Y.
When resumed; the internal state is restored and the process continues.
6. 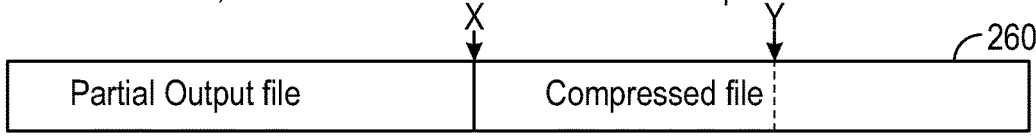

Since X and Y represent the state after the last completed chunk
The partially processed chunk is repeated and the process continues
7. 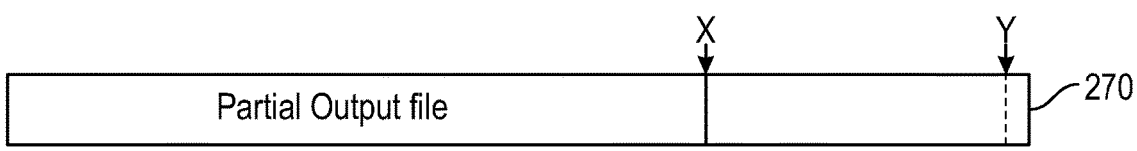

Process completes. Output image is complete.
8. 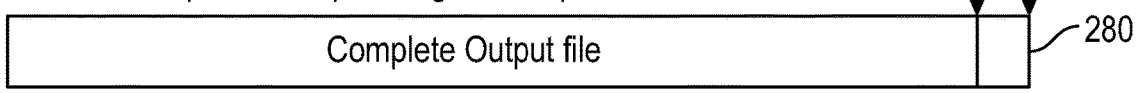

FIG. 2

INTERRUPTABLE BSDIFF DELTA DECOMPRESSION

TECHNICAL FIELD

The present disclosure generally relates efficiently restarting an inplace patching process after an interruption of the inplace patching process occurs.

BACKGROUND

During firmware updates, embedded devices can experience power failure at anytime. One or more delta images are used to speed up firmware transfer. Inplace patching is used after the delta mage is fully transferred.

Interruptions occurring during decompression or the inplace patching process. When the interruptions occur, the output firmware image is incomplete. In addition, the input image is corrupted and has to be retransmitted. Storage size can be increased with additional costs. Another alternative is to forego patching entirely at the expense of transfer time.

As such, when an interruption occurs there is no way of restarting the inplace patching process. Either additional storage has to be added, or the decompression process needs to start at the beginning with the output image being retransmitted.

A need exists to be able to not require additional storage or have to forego decompression altogether. Moreover, a need exists for the inplace patching process to be able to resume at the same state as before the interruption occurred.

Accordingly, there is a need be able to resume inplace patching decompression without requiring additional storage and without requiring the image to be re-transmitted after one or more interruptions. Moreover, there is a need be able to save each completed loop state of the inplace patching process and periodically store the loop local variables.

SUMMARY

The following summary is provided to facilitate an understanding of some of the features of the disclosed embodiments and is not intended to be a full description. A full appreciation of the various aspects of the embodiments disclosed herein can be gained by taking the specification, claims, drawings, and abstract as a whole.

The aforementioned aspects and other objectives can now be achieved as described herein.

In an embodiment, a method includes inputting at least one compressed image in a computing system. The method also includes a process of inplace patching. Another image is decompressed over the compressed image by a processor, wherein local variables are stored periodically. Restored power is received after an interruption to the inplace patching, wherein an execution of the inplace patching is resumed at a later time interval by the processor by restoring the local variables. The method also includes completing the inplace patching process of decompressing the image over the inputted compressed image by the processor after restoring the local variables.

The method also includes performing patching in a single loop.

The method also includes storing loop variables by a memory in one or intervals.

The method also includes decompression process is split into a plurality of intervals.

In an embodiment, inputting a compressed image into one or more computational devices. The method also includes beginning an inplace patching process by a processor. Patching is done in a single loop, wherein a loop state of the inplace patching process is saved by the processor between a generation of output blocks, wherein in response to an interruption to the inplace patching, local variables of the inplace patching process are restored by the processor and the loop for the inplace patching process is continued by the processor. The method also includes completing a final step of the inplace patching process in response to receiving the restored power and restoring the local variables.

The method also includes storing the loop variables periodically.

The loop state is saved between generating output in between generating output data.

The method also includes restarting the inplace patching process to enable an output image to be produced.

In an embodiment, a system includes a computing device positioned to receive at least one inputted compressed image. The system also includes a processor within the computing device that begins an inplace patching process, wherein another image is decompressed over the compressed image, wherein local variables are stored periodically, wherein the processor receives restored power after an interruption to the inplace patching, and wherein the processor resumes execution of the inplace patching at a later time interval by restoring the local variables. The system also includes a memory that stores the completed decompressed image over the inputted compressed image.

The processor generates the decompressed image in consecutive blocks.

The processor saves the loop state of the inplace patching process in between a generation of output blocks of the decompressed image.

The inplace patching process resumes at a same interval as when the interruption occurred.

BRIEF DESCRIPTION OF THE FIGURES

The accompanying figures, in which like reference numerals refer to identical or functionally similar elements throughout the separate views and which are incorporated and form a part of the specification, further illustrate the present invention and, together with the detailed description of the invention, serve to explain the principles of the present invention.

FIG. 2 illustrates schematic process in accordance with the invention;

Figure 1:
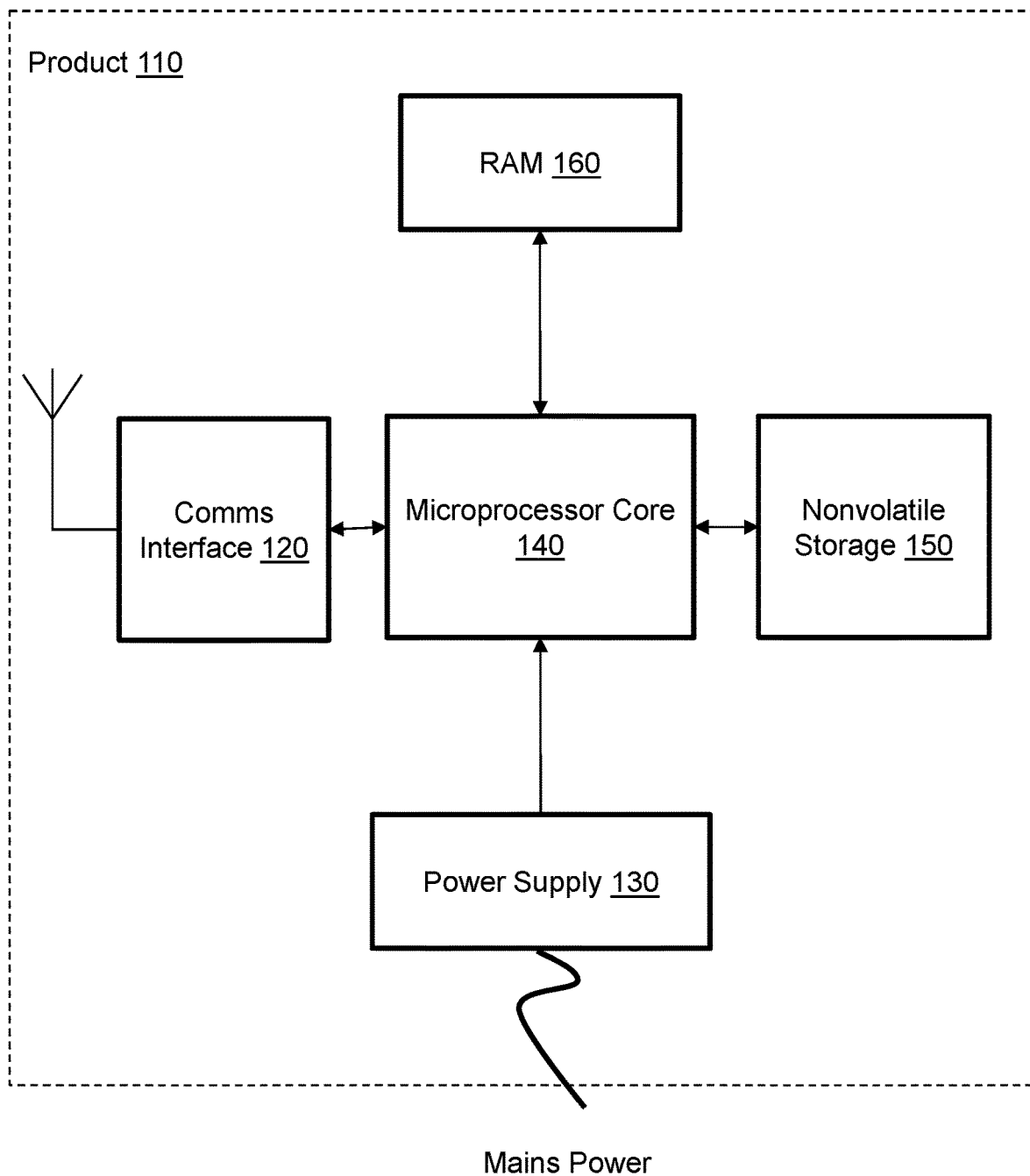
FIG. 1 illustrates a system diagram in accordance with an embodiment of the invention.

Unless otherwise indicated illustrations in the figures are not necessarily drawn to scale.

DETAILED DESCRIPTION OF SOME EMBODIMENTS

Background and Context

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different form and, therefore, covered or claimed subject matter is intended to be construed as not being limited to any example embodiments set forth herein, example embodiments are provided merely to be illustrative. Likewise, a reasonably broad scope for claimed or covered subject matter is intended. Among other issues, subject matter may be embodied as methods, devices, components, or systems. The followed detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein may not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Generally, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as a "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

One having ordinary skill in the relevant art will readily recognize the subject matter disclosed herein can be practiced without one or more of the specific details or with other methods. In other instances, well-known structures or operations are not shown in detail to avoid obscuring certain aspects. This disclosure is not limited by the illustrated ordering of acts or events, as some acts may occur in different orders and/or concurrently with other acts or events. Furthermore, not all illustrated acts or events are required to implement a methodology in accordance with the embodiments disclosed herein.

Unless defined otherwise, all technical and scientific terms used herein have the same meanings as commonly understood by one of ordinary skill in the art to which the disclosed embodiments belong. Preferred methods, techniques, devices, and materials are described, although any methods, techniques, devices, or materials similar or equivalent to those described herein may be used in the practice or testing of the present invention.

Although claims have been included in this application to specific enumerated combinations of features, it should be understood the scope of the present disclosure also includes any novel feature or any novel combination of features disclosed herein.

References to "an embodiment," "example embodiment," "various embodiments," "some embodiments," etc., may indicate that the embodiment(s) so described may include a particular feature, structure, or characteristic, but not every possible embodiment necessarily includes that particular feature, structure, or characteristic.

Headings provided are for convenience and are not to be taken as limiting the present disclosure in any way.

Each term utilized herein is to be given its broadest interpretation given the context in which that term is utilized.

Terminology

The following paragraphs provide context for terms found in the present disclosure (including the claims):

The transitional term "comprising", which is synonymous with "including," "containing," or "characterized by," is inclusive or open-ended and does not exclude additional, unrecited elements or method steps. See, e.g., *Mars Inc. v. H. J. Heinz Co.*, 377 F.3d 1369, 1376, 71 USPQ2d 1837, 1843 (Fed. Cir. 2004) ("[L]ike the term 'comprising,' the terms 'containing' and 'mixture' are open-ended."). "Configured to" or "operable for" is used to connote structure by indicating that the mechanisms/units/components include structure that performs the task or tasks during operation. "Configured to" may include adapting a manufacturing process to fabricate components that are adapted to implement or perform one or more tasks.

"Based On." As used herein, this term is used to describe factors that affect a determination without otherwise precluding other or additional factors that may affect that determination. More particularly, such a determination may be solely "based on" those factors or based, at least in part, on those factors.

All terms of example language (e.g., including, without limitation, "such as", "like", "for example", "for instance", "similar to", etc.) are not exclusive of other examples and therefore mean "by way of example, and not limitation . . . ".

A description of an embodiment having components in communication with each other does not infer that all enumerated components are needed.

A commercial implementation in accordance with the scope and spirit of the present disclosure may be configured according to the needs of the particular application, whereby any function of the teachings related to any described embodiment of the present invention may be suitably changed by those skilled in the art.

The flowchart and block diagrams in the figures illustrate the architecture, functionality, and operation of possible implementations of systems and methods according to various embodiments. Functions noted in the block may occur out of the order noted in the figures. For example, two blocks shown in succession may, in fact, be executed substantially concurrently, or the blocks may sometimes be executed in the reverse order, depending upon the functionality involved.

Further, any sequence of steps that may be described does not necessarily indicate a condition that the steps be performed in that order. Some steps may be performed simultaneously.

The functionality and/or the features of a particular component may be alternatively embodied by one or more other devices that are not explicitly described as having such functionality/features. Also, various embodiments of the present invention need not include a device itself.

More specifically, as will be appreciated by one skilled in the art, aspects of the present invention may be embodied as a system and/or method. Furthermore, aspects of the present invention may take the form of a plurality of systems to enable a gas meter to perform self-checking to determine its overall functioning without requiring a meter operator.

Introduction

Embodiments of the present invention include a computing system including a microprocessor core that receives an inputted compressed image. At an initial state, an inputted compressed image is received.

At an intermediate loop state, the inplace patching process can occur. The microprocessor core within the computing device or system can begin to decompress another image over the inputted compressed image. An output block of the decompressing image will be produced after each state or interval of the decompressing image is produced. The decompressing image will be decompressed over at least one flash sector (as indicated by the blank area) and over the inputted compressed image. After a state of the decompression process is completed, the microprocessor core will save the loop state of the inplace patching process. The memory/internal RAM will store the loop local variables periodically as well.

Interruptions can occur at various states or intervals of the decompression or inplace patching process. At either an intermediate state or final state of the decompression process, an interruption can occur. Power failures or other issues with the computing system can cause an interruption to the decompression process. However, the microprocessor core saves the loop state after each state of the inplace process is completed. The internal RAM will also periodically store the loop local variables. As such, when an interruption occurs, each completed loop state of the decompression or inplace patching process has already been saved. As a result, when restored power is received to resume the decompression process, the decompression process can resume at the state in which the interruption occurred instead of having to resume at the beginning and have the decompressing image be re-transmitted.

Although interruptions can occur periodically whether the decompression or inplace patching process is at an intermediate or a final state of the decompression state, the loop state is saved after each completed state. In addition, the loop local variables are periodically stored. As such, the decompression process will never have to return to initial state to begin the decompression process again. Therefore, no completed states of the decompression process are lost due to any interruptions.

System Structure

FIG. 1 illustrates a high-level system diagram (system) 100 in an embodiment of the invention. The system 100 can include an output or product 110. In addition, the system 100 can include a communication (comms) interface 120. In addition, a power supply 130 that includes main power can be provided to a microprocessor core 140. A random access memory (RAM) 160 is also connected to the microprocessor core 140. The RAM 160 can store the local loop variables of the inplace patching process. The microprocessor core 140 can perform the key functions for the system 140. The microprocessor core 140 can perform the functions such as saving a loop state after each state of the decompression process or inplace patching process is completed. With the microprocessor core 140 saving the loop state when the decompression at that state is completed, the decompression can resume at the state at which the interruption occurs after power is restored. The RAM 160 can be used to store various input and output. Further, a nonvolatile storage 150 is connected to the microprocessor core 140. The nonvolatile storage 150 can be used store various input and output as well.

Referring to FIG. 2, a decompression or inplace patching process 200 in an embodiment of the invention is described in more detail. At 210, an internal or external memory space 210 is shown. The internal or external memory can include RAM, Flash, EEPRROM. At 220, a compressed input file is loaded into the external or internal memory space. At 230, an inplace patching process begins. Output is produced as input is consumed. A decompression process begins in which an output file represented by variable X will be decompressed and override the inputted compressed image represented by variable Y. An image is decompressed over the inputted compressed image. As will be illustrated, the inputted compressed image Y is overwritten by output image X as the delta decompression progresses. At 240, the decompression process is performed in output blocks as shown by Xn and Xn+1. The portions of the inputted compressed image being overwritten by the output decompressing image is also shown by Yn and Yn+10 The inplace patching is done in a single loop that consumes input and produces output in a sequential fashion. The variables X and Y are updated after an output block is complete. In addition, a loop state is saved each lime an output block is completed. The microprocessor core saves the loop state after the generation of each output block and between the generation of each output block. As such, when an interruption occurs during the inplace patching process, the inplace patching process can resume at the same interval when the power is restored. The output image does not need to be re-transmitted.

In FIG. 2, at step 250 the decompression or inplace patching process 200 is illustrated further wherein the inputted compressed image is overwritten as the output file is produced. The decompressed image will override the inputted compressed image. At 260, an interruption can occur. The microprocessor core saves the loop state to enable the inplace patching process 200 to resume at the same interval once restored power is received. As such, if an interruption of the decompression or inplace patching process 200 occurs, the microprocessor core has already saved the loop state after each output block is generated. The point at which the decompression process 200 was interrupted is effectively saved. As such, when the power is restored and the decompression process 200 resumes, the decompression or inplace patching process 200 continues from where it left off. The output image does not need to be re-transmitted.

Referring to FIG. 2, at 270, as power is restored and the decompression or inplace patching process 200 continues, the variables X and Y represent the loop state after the last completed chunk or output block of the decompression process 200. At 280, the decompression process is completed and the output image is complete. The decompressed output image completely overrides the inputted compressed image.

Figure 3:
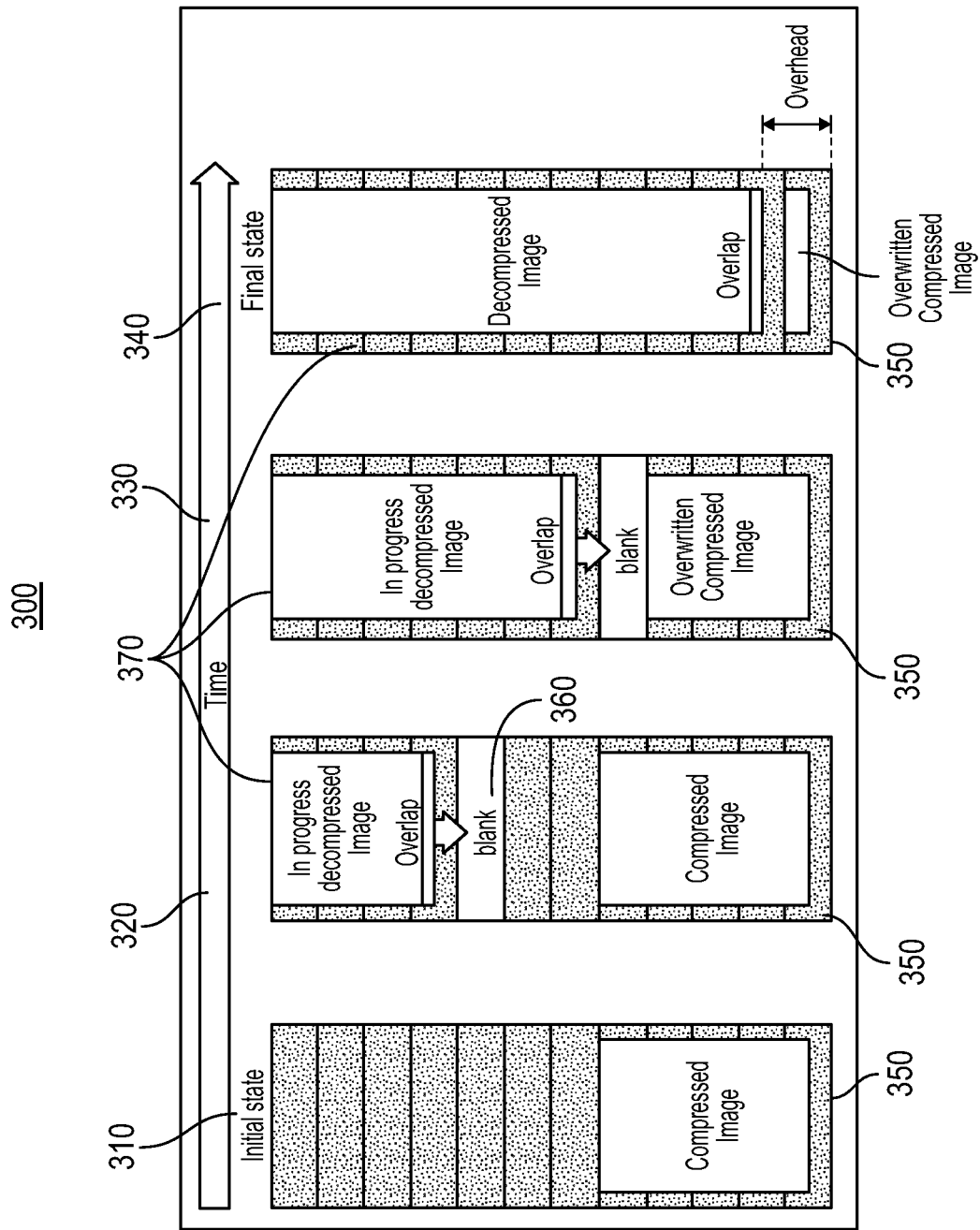
FIG. 3 illustrates a diagrams in accordance with an embodiment of the invention.

With respect to FIG. 3, an embodiment of the inplace patching process 300 is illustrated in various intervals. At an initial state 310, a compressed image 350 is inputted into the computing device. The compressed image 350 will be the input within the external/internal memory. At another state 320, a decompression or inplace patching process 300 begins with an in progress decompressed image 370 being decompressed. The decompressed image 370 will be the output that will be decompressed and override the inputted compressed image 350.

In FIG. 3, the inplace patching process 300 will be performed in a single loop that consumes input or the inputted compressed image 350 and produces output or the decompressed image 370 sequentially. The RAM will periodically store the loop variables. The microprocessor core will save the loop state after each completed state. As such, by periodically storing the loop variables and saving each loop state of the inplace patching process 300, execution of the inplace patching process 300 can be resumed at a later time interval by restoring the local variables and continuing the loop. In addition, the output data of the decompressed image 370 is produced in blocks. The microprocessor core saves the loop state after each output block is generated. Moreover, the time at which the loop state is saved is chosen to be generated between consecutive blocks.

Referring to FIG. 3, the decompressed image 370 is decompressed over at least one flash sector 360, as illustrated by the blank area, and over the inputted compressed image. During an intermediate state 320, the decompression process 300 can be interrupted. An interruption can occur due to a loss of power. The loop state of the decompression process 300 is saved after each output block is produced, and the loop variables can be stored. As such, when the power is restored, the decompression process 300 can resume at the intermediate state 320 to decompress the decompressing image 370. Similarly, another intermediate state 330 is shown. During the additional intermediate state 330, the decompressing mage 370 can begin to override the inputted compressed image 350. The decompression process 300 enables the decompressing image 370 to override the inputted compressed image 350. Further, should an interruption occur at the additional intermediate state 330, the loop state will be saved when the output block from first intermediate state 320 was completed and the loop variables are stored to enable the decompression process 300 to resume at the additional intermediate state 330 when the power is restored. As such, for the intermediate states 320, 330, an interruption can occur at either intermediate state 320, 330. When the interruption occurs, the loop state is saved when each intermediate state 320, 330 is completed so that the decompression process 300 can resume at that same state. The output decompressing image does not need to be re-transmitted.

In FIG. 3, a final state 340 is shown. At the final state 340, the decompression process 300 can be completed. The last output block of the decompression process or inplace patching process 300 is completed. When the inplace patching process 300 is completed, the decompressing image 370 will completely override the inputted compressed image 350, and become fully decompressed. As with the intermediate states 320, 330 described above, an interruption can occur at the final state 340. The microprocessor core or memory will periodically store the loop variables and save the loop state after each output block is generated. As a result, after power is restored, the inplace patching process 300 can resume. The decompressing image 370 can be fully decompressed and override the inputted compressed image 350.

Referring to FIG. 3, the inplace patching process 300 is done in a single loop that consumes the inputted compressed image 350 and produces the output or the decompressing image 370. The memory or microprocessor core will store the loop variables. The microprocessor core will save the loop state after each output block is generated. When any interruptions occur, the previous state or output block has been saved. The inplace patching process or decompression process 300 can resume from the point at which the process was interrupted, wherein the output image does not need to be re-transmitted.

Figure 4:
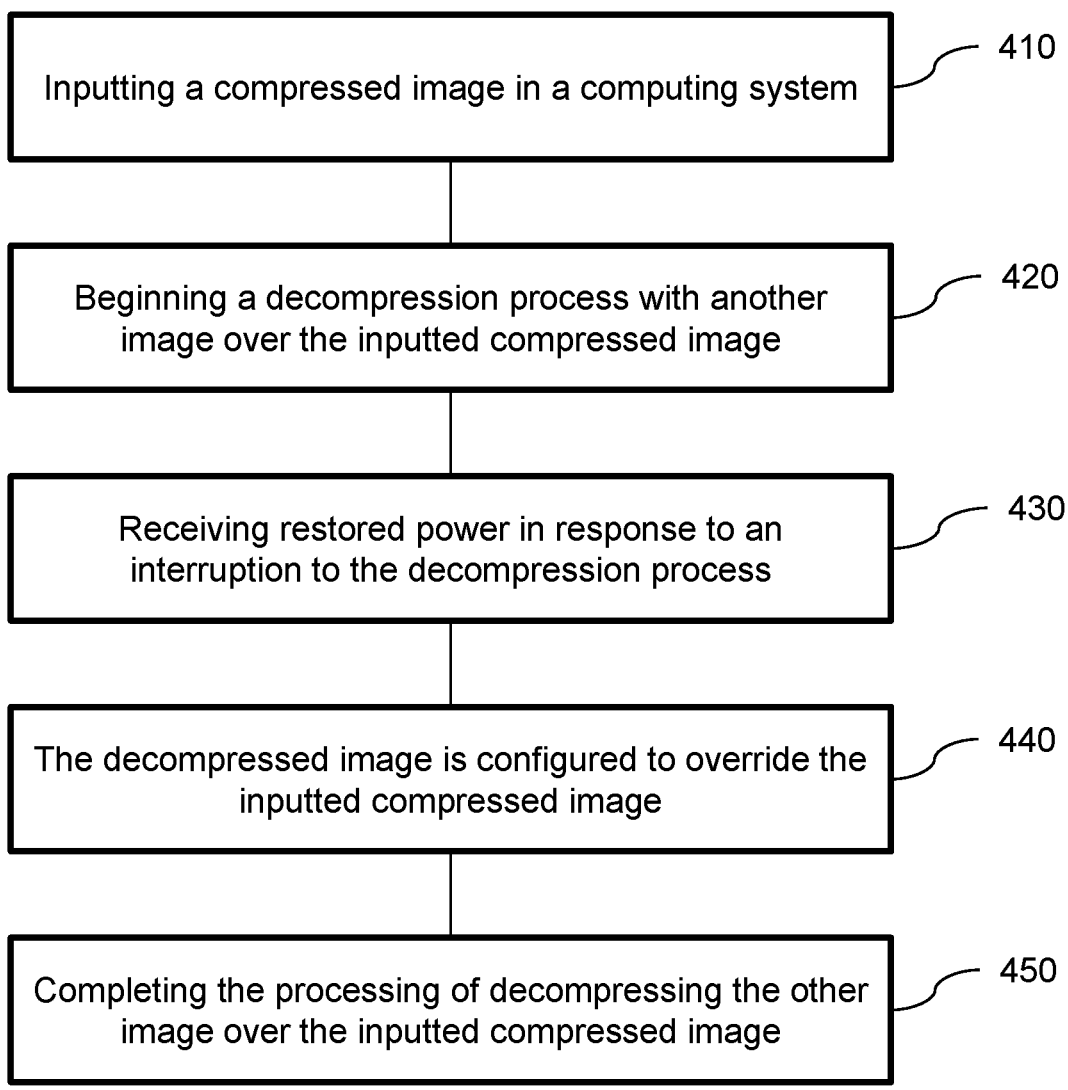
FIG. 4 depicts a flow chart in accordance with an embodiment of the invention.

In FIG. 4, a flowchart illustrating the decompression process or inplace patching process 400 of the invention is illustrated. During the decompression process 400, one or more interruptions can occur, such as when power is lost. Nevertheless, loop variables of the inplace patching process 400 are stored periodically. In addition, the loop state after each output block is saved. Accordingly, when there is an interruption, inplace patching process 400 can resume at the same interval as when the interruption occurred.

Referring to FIG. 4, at step 410, a compressed image is inputted into a computing system. The computing system can include one or more computational devices. The compressed image can be inputted into the computing system at an initial state.

In FIG. 4, at step 420, the inplace patching process 400 can begin. An output image can begin to be decompressed over at least one flash sector and the inputted compressed image. This state can be an intermediate state of the decompression process. During this intermediate state, an interruption can occur due to a loss of power. The RAM will store the loop variables periodically and the microprocessor core will save the loop state after each output block of the decompressing image is saved. As a result, when power is restored, the inplace patching process 400 can resume, and the output image can continue to be decompressed. The output decompressing image does not need to be re-transmitted.

In FIG. 4, at step 430, after an interruption, restored power can be received. The computing system can receive the restored power. When the restored power is received, the decompression process can resume at the state in which the interruption occurred. The decompressing image does not need to be re-transmitted as the loop variables are stored periodically, and the loop state is saved after each output block is generated.

In FIG. 4 at step 440, the decompressing image is configured to override the inputted image. The decompressing image is decompressed over at least one flash sector over the inputted compressed image. As the decompressing process 400 progresses, the decompressing image will override the inputted compressed image.

Referring to FIG. 4, at step 450, the decompression process 400 is completed. The decompressing image is fully decompressed. The fully decompress image completely overrides the inputted compressed image.

Those skilled in the art will appreciate that the example embodiments are non-exhaustive and that embodiments other than that described here may be included without departing from the scope and spirit of the presently disclosed embodiments.

Advantages/Summary

Overall, an inplace patching process can be performed in a single loop that consumes an inputted compressed image and produces an output of a decompressing image. Moreover, as a function of the inplace patching process, the received inputted compressed image will be overridden as the inplace processing continues.

The microprocessor core or memory within the computing system will store the loop local variables of the inplace patching process periodically. In addition, the microprocessor core will save the loop state after each output block of the decompressing image is generated. Accordingly, when an interruption occurs at one or more of the intermediate states during the inplace patching process, the loop variables have been stored, and the loop state for each completed block of the output of the decompressing image is saved. As a result, when restored power is received by the computing system, the microprocessor core can resume the inplace patching process at the same state in which the inplace patching process was interrupted. The decompressing image does not need to be re-transmitted.

The inplace patching process produces an output block for each completed state of the decompressing image. After each completed state, an output block of the decompressing image is produced. Moreover, after each state, the decompressing image continues to override the inputted compressed image. After each completed state, the microprocessor core will save the loop state. In addition, as also mentioned above, the loop variables will be stored periodically. The periodic interruptions that can occur do not prevent the inplace patching process from resuming from where the inplace patching process was interrupted.

At the final state, the output or decompressing image is fully decompressed. The decompressed image completely overrides the inputted compressed image to complete the inplace patching process.

In summary, the inplace patching process enables an output decompressing image to override an inputted compressed image. Further, the computing device periodically stores the loop variables of the inplace patching process. In addition, the microprocessor core of the computing device saves the loop state after each output block of the decompressing image is generated. As a result, the inplace patching process can resume at the same state after restored power is receive after an interruption to the inplace patching process as occurred. The inplace patching process can be completed when the decompressing image is fully decompressed and completely overrides the inputted compressed image.

Conclusion

All references, including granted patents and patent application publications, referred herein are incorporated herein by reference in their entirety.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Various aspects of the invention have been described above by way of illustration, and the specific embodiments disclosed are not intended to limit the invention to the particular forms disclosed. The particular implementation of the system provided thereof may vary depending upon the particular context or application. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

The corresponding structures, materials, acts, and equivalents of all means or step plus function elements in the claims below are intended to include any structure, material, or act for performing the function in combination with other claimed elements as specifically claimed.

What is claimed is:

1. A method comprising:
inputting at least one compressed image in a computing system;
beginning a process of inplace patching, wherein another image is decompressed over the inputted at least one compressed image by a processor, wherein local variables are stored periodically, wherein restored power is received after an interruption to the inplace patching, and wherein an execution of the inplace patching is resumed at a later time interval by the processor by restoring the local variables;
producing output data in one or more blocks;
wherein a loop state of the inplace patching process is saved after generation of each output block and between the generation of the each output block; and
completing the inplace patching process of decompressing the compressed image over the inputted at least one compressed image by the processor after restoring the local variables.

2. The method of claim 1, further comprising:
performing patching in a single loop.

3. The method of claim 1, further comprising:
storing loop variables by a memory at one or more intervals.

4. The method of claim 1, wherein the loop state is saved between the generation of consecutive output blocks.

5. The method of claim 1, further comprising:
consuming input and producing output sequentially.

6. A method comprising:
inputting a compressed image into one or more computational devices;
beginning an inplace patching process by a processor, wherein another image is decompressed over the inputted compressed image by the processor, wherein patching is done in a single loop, wherein output data is produced in one or more blocks, wherein a loop state of the inplace patching process is saved by the processor after generation of each output block and between the generation of the each output blocks, wherein in response to an interruption to the inplace patching, local variables of the inplace patching process are restored by the processor and the inplace patching process is continued by the processor; and
completing a final step of the inplace patching process by the processor in response to receiving the restored power and restoring the local variables.

7. The method of claim 6, further comprising:
storing the local variables periodically.

8. The method of claim 6, wherein the loop state is saved between generating output data.

9. The method of claim 6, further comprising:
restarting the inplace patching process to enable an output image to be produced.

10. The method of claim 6, further comprising:
producing an output image in consecutive blocks within the single loop.

11. The method of claim 6, wherein an output image is configured to override the inputted compressed image.

12. The method of claim 6, wherein the final step of the inplace patching process is completed by an output image overriding the inputted compressed image.

13. A system comprising:
a computing device positioned to receive at least one inputted compressed image;
a processor within the computing device that begins an inplace patching process, wherein another image is decompressed over the at least one inputted compressed image, wherein local variables are stored periodically, wherein the processor receives restored power after an interruption to the inplace patching, and wherein the processor resumes execution of the inplace patching at a later time interval by restoring the local variables, wherein output data is produced in one or more blocks; wherein the processor saves a loop state of the inplace patching process after generation of each output block and between the generation of the each output block; and a memory that stores the completed decompressed image over the at least one inputted compressed image that is fully decompressed to complete the inplace patching process after the local variables are restored.

14. The system of claim 13, wherein the processor generates the decompressed image in consecutive blocks.

15. The system of claim 13, wherein the processor saves the loop state of the inplace patching process in between a generation of output blocks of the decompressed image.

16. The system of claim 13, wherein the inplace patching process resumes at a same interval as when the interruption occurred.

17. The system of claim 13, wherein the decompressed image is not re-transmitted after the processor receives the restored power.

18. The system of claim 13, wherein the decompressed image is produced in consecutive blocks, wherein the decompressed image is continuously overriding the inputted compressed image.

* * * * *